(12) United States Patent
Fukada et al.

(10) Patent No.: US 6,300,206 B1
(45) Date of Patent: Oct. 9, 2001

(54) METHOD FOR MANUFACTURING SEMICONDUCTOR DEVICE

(75) Inventors: Shinichi Fukada, Hino; Naotaka Hashimoto, Koganei; Masanori Kojima, Fussa, all of (JP); Hiroshi Momiji, London (GB); Hiromi Abe, Tokyo; Masayuki Suzuki, Kokubunji, both of (JP)

(73) Assignees: Hitachi, Ltd.; Hitachi ULSI Systems Co., Ltd., both of Tokyo (JP)

( * ) Notice: Subject to any disclaimer, the term of this patent is extended or adjusted under 35 U.S.C. 154(b) by 0 days.

(21) Appl. No.: 09/486,899

(22) PCT Filed: Sep. 19, 1997

(86) PCT No.: PCT/JP97/03328

§ 371 Date: Mar. 3, 2000

§ 102(e) Date: Mar. 3, 2000

(87) PCT Pub. No.: WO99/16116

PCT Pub. Date: Apr. 1, 1999

(51) Int. Cl.$^7$ .................................................. H01L 21/331
(52) U.S. Cl. ........................ 438/303; 438/304; 438/305
(58) Field of Search ..................... 438/303, 304, 438/305, 306, 307, 308, 533, 586, 592, 649, 655; 257/369, 388, 374

(56) References Cited

U.S. PATENT DOCUMENTS

| | | | | |
|---|---|---|---|---|
| 5,563,100 | * | 10/1996 | Matsubara | 438/200 |
| 5,728,625 | * | 3/1998 | Tung | 438/586 |
| 5,818,092 | * | 10/1998 | Bai et al. | 257/388 |
| 5,888,888 | * | 5/1999 | Talwar et al. | 438/533 |
| 5,899,720 | * | 5/1999 | Mikagi | 438/303 |

FOREIGN PATENT DOCUMENTS

| | | |
|---|---|---|
| 8186085 | 7/1996 | (JP) . |
| 8274047 | 10/1996 | (JP) . |

* cited by examiner

*Primary Examiner*—David Nelms
*Assistant Examiner*—Dung A Le
(74) *Attorney, Agent, or Firm*—Antonelli, Terry, Stout & Kraus, LLP

(57) ABSTRACT

A implantation step of a dopant ion for forming source and drain regions (S and D) is divided into one implantation of a dopant ion for forming a p/n junction with a well region (3), and one implantation of a dopant ion that does not influence a position of the p/n junction between the source and drain regions (S and D) and the well region with a shallow implantation depth and a large implantation amount. After conducting an activation heat treatment of the dopant, a surface of the source/drain region is made into cobalt silicide 12, so that the source/drain region (S and D) can have a low resistance, and a p/n junction leakage can be reduced.

37 Claims, 8 Drawing Sheets

FIG. 19

CoSi₂ LAYER THICKNESS t: 30 nm
JUNCTION DEPTH $X_j$: 240 um
SPECIFICATION (1): $1 \times 10^{-13}$ A/um² (AT 5V)
SPECIFICATION (2): $5 \times 10^{-14}$ A/um² (AT 5V)
JUNCTION AREA: $2 \times 10^5$ um²
NUMBER OF SAMPLES: 20

| THICKNESS OF HIGH CONCENTRATION LAYER | NUMBER AND RATIO OF SAMPLES SATISFYING SPECIFICATION (1) | NUMBER AND RATIO OF SAMPLES SATISFYING SPECIFICATION (2) |
|---|---|---|
| 22 nm (INVENTION) | 20 (100%) | 20 (100%) |
| 27 nm (INVENTION) | 20 (100%) | 20 (100%) |
| 33 nm | 20 (100%) | 18 (90%) |
| 40 nm | 18 (90%) | 12 (60%) |
| 65 nm (COMPARATIVE EXAMPLE) | 12 (60%) | 1 (5%) |

GENERATION OF p⁺/n JUNCTION LEAKAGE ON VARIATION OF THICKNESS OF HIGH CONCENTRATION LAYER

FIG. 20

CoSi₂ LAYER THICKNESS t: 30 nm
THICKNESS OF HIGH CONCENTRATION LAYER: 27 um
SPECIFICATION (1): $1 \times 10^{-13}$ A/um² (AT 5V)
SPECIFICATION (2): $5 \times 10^{-14}$ A/um² (AT 5V)
JUNCTION AREA: $2 \times 10^5$ um²
NUMBER OF SAMPLES: 20

| JUNCTION DEPTH $X_j$ | NUMBER AND RATIO OF SAMPLES SATISFYING SPECIFICATION (1) | NUMBER AND RATIO OF SAMPLES SATISFYING SPECIFICATION (2) |
|---|---|---|
| 57 nm (HIGH CONCENTRATION LAYER ONLY) | 0 (0%) | 0 (0%) |
| 100 nm | 15 (75%) | 8 (40%) |
| 120 nm (INVENTION) | 20 (100%) | 20 (100%) |
| 150 nm (INVENTION) | 20 (100%) | 20 (100%) |
| 240 nm (INVENTION) | 20 (100%) | 20 (100%) |

GENERATION OF p⁺/n JUNCTION LEAKAGE ON VARIATION OF JUNCTION DEPTH

FIG. 21

CoSi₂ LAYER THICKNESS t: 30 nm
THICKNESS OF HIGH CONCENTRATION LAYER: 27 um
JUNCTION DEPTH Xj: 240 um
SPECIFICATION (1): $1 \times 10^{-13}$ A/um² (AT 5V)
SPECIFICATION (2): $5 \times 10^{-14}$ A/um² (AT 5V)
JUNCTION AREA: $2 \times 10^5$ um²
NUMBER OF SAMPLES: 20

| CONDITIONS OF ACTIVATION HEAT TREATMENT | NUMBER AND RATIO OF SAMPLES SATISFYING SPECIFICATION (1) | NUMBER AND RATIO OF SAMPLES SATISFYING SPECIFICATION (2) |
|---|---|---|
| 850 °C, 5 min | 12 (60%) | 6 (30%) |
| 850 °C, 30 min | 18 (90%) | 15 (75%) |
| 900 °C, 60 sec (INVENTION) | 20 (100%) | 20 (100%) |
| 900 °C, 15 sec (INVENTION) | 20 (100%) | 20 (100%) |
| 1000 °C, 10 sec (INVENTION) | 20 (100%) | 20 (100%) |

GENERATION OF p⁺/n JUNCTION LEAKAGE ON VARIATION OF CONDITIONS OF ACTIVATION HEAT TREATMENT

FIG. 22

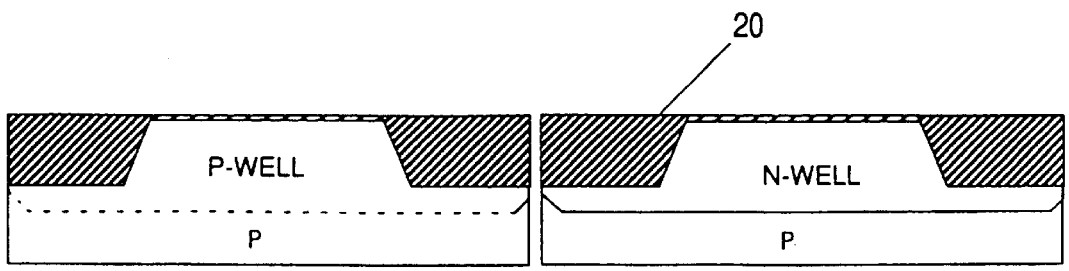

METHOD FOR MANUFACTURING SEMICONDUCTOR DEVICE

TECHNICAL FIELD

The present invention relates to the technical field of semiconductor manufacture, and particularly, to a method of fabricating a semiconductor device that must be operated at a high speed.

BACKGROUND OF THE INVENTION

At the present time, in order to realize high speed operation of a MOS transistor constituting a MOS LSI, it has became important to decrease the sheet resistance of the source and drain electrodes, the contact resistance of an electrode and wiring, and the parasitic capacitance of the source and drain.

In order to cope with the requirement, a structure, in which the source and drain surface is subjected at once to silicidation in a self-aligning manner, is applied particularly to a semiconductor device that must be operated at a high speed. In this structure, the surface of the electrodes is covered with a silicide having a low resistance, such as titanium silicide ($TiSi_2$), cobalt silicide ($CoSi_2$) and the like, to decrease the sheet resistance, and the contact resistance with wiring can also be decreased to a large extent in comparison with the conventional metal-semiconductor contact. Since the area of the source and drain can be reduced, the parasitic capacitance can also be reduced. Furthermore, the so-called salicide (self-aligned silicide) technique, in which, upon subjecting the surface of the source and drain to silicidation, the upper part of a gate electrode is also simultaneously subjected to silicidation in a self-aligning manner, is also widely employed.

In the case where $TiSi_2$ is used, it is constituted with a metastable phase (C45 structure) having a relatively high specific resistance and a stable phase (C54 structure) having a relatively low specific resistance. The conversion of the metastable phase (C45 structure) to the stable phase (C54 structure) can be conducted by a heat treatment at about 800° C. However, the temperature must be increased with an increase in the fineness of the pattern. That is, it has been known that there is a thin line width effect, in which the phase transfer is difficult to achieve with a fine pattern (for example, 0.2 μm or less). Therefore, in order to realize a fine pattern having a gate line width of 0.2 μm or less, the heat treatment temperature for the phase transfer must be increased. Accordingly, the heat treatment temperature affects the fine source/drain diffusion layer.

A MOS LSI of recent years is constituted with a complementary MOS transistor for low electric power consumption. Therefore, it is necessary to form a silicide layer on silicon having various dopants, such as an $N^+$-type single crystal silicon region (N-type source/drain), a $P^+$-type single crystal silicon region (P-type source/drain), an $N^+$-type polycrystalline silicon gate electrode and a $P^+$-type polycrystalline silicon gate electrode. In the case of $TiSi_2$, the formation temperature thereof is greatly influenced by the dopant. In general, the thickness on the $N^+$-type silicon becomes from 60 to 70% of that on the $P^+$-type silicon. This is because Ti attracts an N-type dopant, and, as a result, the silicidation reaction is inhibited.

On the other hand, instead of $TiSi_2$ which has the above-mentioned problems, $CoSi_2$ is being applied, since it has a small thin line effect and a small influence from the dopant.

A MOS type semiconductor device having a salicide structure, to which $CoSi_2$ is applied, is disclosed, for example, in Japanese Patent Laid-Open No. 186085/1996 and Japanese Patent Laid-Open No. 274047/1996. According to these publications, the problems of increase injunction leakage electric current and deterioration injunction withstand voltage in applying $CoSi_2$ and the solutions thereof are disclosed. The problems occur due to the following factors.

Before forming a cobalt film by sputtering, a spontaneous oxide film is formed on a surface of a diffusion layer, and when the formation of the cobalt layer and the first heat treatment are conducted under that condition, an interface between the diffusion layer and the CoSi film becomes non-uniform and uneven. An interface between the diffusion layer obtained by the second heat treatment and the $CoSi_2$ film cannot escape from the influence of the form of the interface between the diffusion layer and the CoSi film. Furthermore, because an increase in volume is associated with the conversion from the CoSi film to the $CoSi_2$ film, the distance between the PN junction interface of the diffusion layer and the uneven bottom surface of the $CoSi_2$ film becomes small. Accordingly, an increase in junction leakage electric current and deterioration injunction withstand voltage in the diffusion layer are liable to occur.

According to the technique disclosed in the former publication, after removing the spontaneous oxide film on the surface of the diffusion layer by use of a hydrogen plasma in a vacuum apparatus, bis(methylcyclopentadienyl) cobalt is evaporated without breaking the vacuum, and a cobalt film is formed by a CVD method in which the gas is subjected to thermal decomposition.

According to the technique disclosed in the later publication, after removing the spontaneous oxide film on the surface of the diffusion layer by use of a hydrogen plasma in a vacuum apparatus, a cobalt film is formed by a CVD method in which an evaporated gas of bis (hexafluoroacetylacetonato)cobalt is reduced with a hydrogen gas without breaking the vacuum.

The present inventors have revealed that in the case of $CoSi_2$, an increase injunction leakage electric current and deterioration injunction withstand voltage occurs due to the following problems that occur completely separately from the problem of increase in junction leakage electric current and deterioration injunction withstand voltage due to the spontaneous oxide film disclosed in the publications.

As one of the measures for preventing the junction leakage between the source/drain and the well when the source/drain is converted to $CoSi_2$, a shut current experimentation has been conducted. As a result, it has been found that a sample having a large implantation energy to form concentrated p+ and n+ layers to a large depth exhibit a large amount of junction leakage. This is a result that is completely contrary to expectation. As a result of analysis, it has been found that the junction leakage is ascribed to defects due to ion implantation, and thus the sample subjected to ion implantation at a high energy and a high dose exhibits increased junction leakage.

Therefore, in the silicidation technique on the general source and drain (an Si semiconductor region), because a silicide is formed by reacting a metallic film formed on the Si semiconductor region with Si, silicide abnormally grown to be an acicular shape and a metallic atom diffused into the Si semiconductor region reach the p/n junction formed under the Si semiconductor region, or silicide is abnormally grown in the horizontal direction to reach the p/n junction at the edge part (the vicinity of the bird's beak) of the element isolation (LOCOS) region, so as to increase the junction leakage. This problem becomes severe when $CoSi_2$ is selected as the silicide. The abnormal growth occurs due to ion implantation damage, so-called residual defects, that occurs by ion implantation in a high concentration (about $1 \times 10^{20}$ atoms/cm$^2$ or more) to a substrate for forming a source and drain, which is not recovered by the annealing performed later.

As one of the solutions thereof, it can be considered that the film thickness of the CoSi$_2$ formed on the source and drain is made thin. In this case, while the junction leakage can be lowered, the object of decreasing the sheet resistance of the source and drain cannot be achieved. Furthermore, when the film thickness of the CoSi$_2$ is decreased, the CoSi$_2$ film is worn to the extent that it will disappear by over-etching on dry etching to form a contact hole, so as to increase the danger of increasing the contact resistance. Accordingly, the film thickness of the CoSi$_2$ on the source and drain cannot be decreased without limitation.

Therefore, an object of the invention is to provide a method of fabricating a semiconductor device that attains a silicide contact while suppressing any increase in junction leakage electric current and deterioration in junction withstand voltage.

Another object of the invention is to provide a method of fabricating a semiconductor device having a fine wiring pattern that can be operated at a high speed.

Furthermore, a further object of the invention is to provide a method of fabricating a CMOS semiconductor device having a fine wiring pattern that can be operated at a high speed.

Still further, a more specific object of the invention is to form a CoSi$_2$ film on a source and drain without increasing the junction leakage of a p/n junction under the source and drain. In particular, it is an object to form a CoSi$_2$ film having a sufficient thickness to decrease the sheet residence on the source and drain without increasing the junction leakage of a p/n junction under the source and drain.

SUMMARY OF THE INVENTION

The invention comprises a first step of implanting, into a prescribed region of a semiconductor primary surface of a semiconductor main body having introduced thereto a first conductive type impurity, an ion of a second conductive type, which is the reverse of the first conductive type, to form a semiconductor region constituting a PN junction with the semiconductor; a second step of implanting, into a surface of the prescribed region, an ion of the second conductive type impurity, to form a metal-semiconductor alloy layer to a prescribed thickness; and then a step of forming, on a surface of the prescribed region having been subjected to the second step, a metal-semiconductor alloy layer formed by reacting a metal and a semiconductor.

By conducting the ion implantation by separating the ion implantation for forming the PN junction (the first step) from the ion implantation for forming the metal-semiconductor alloy layer (the second step), it becomes possible that formation of residual defects in the deep ion implantation region near the position of the PN junction will be suppressed, and in the shallow ion implantation region at the surface region, the metal-semiconductor alloy layer having a thickness sufficient to decrease the sheet resistance is formed.

The invention also comprises a first step of implanting, into a primary surface of a first semiconductor region of a first conductive type comprising silicon, an ion of a second conductive type impurity, which is the reverse of the first conductive type, to form a second semiconductor region constituting a PN junction with the first semiconductor region; a second step of implanting, into the primary surface of the first semiconductor region, an ion of the second conductive type impurity to a prescribed dose amount, to form a silicide layer to a prescribed thickness; thereafter a step of forming the second semiconductor region by a heat treatment; a step of coating a metallic layer over a surface of the second semiconductor region; and a step of reacting the metallic layer with silicon of the second semiconductor region by a heat treatment, to form a metallic silicide layer.

According to the foregoing procedures, it becomes possible that formation of residual defects in the deep ion implantation region near the position of the PN junction will be suppressed, and in the shallow ion implantation region at the surface region, the metallic silicide layer having a thickness sufficient to decrease the sheet resistance is formed. Thus, the metallic silicide layer having a low resistance that does not increase the PN junction leakage can be formed on the surface of the semiconductor region.

The invention also comprises a step of thermally oxidizing a primary surface of a first semiconductor region of a first conductive type comprising silicon, to form a gate insulating film; a step of pattern forming a gate electrode comprising polycrystalline silicon on the gate insulating film; a first step of implanting, into a part of the primary surface of the first semiconductor region not having the gate electrode formed, an ion of a second conductive type impurity; a step of forming a side wall spacer on a side wall of the gate electrode; a second step of implanting, into a part of the primary surface of the first semiconductor region not having the gate electrode and the side wall spacer formed, an ion of a second conductive type impurity, which is the reverse of the first conductive type, to form a source/drain region constituting a PN junction with the first semiconductor region; a third step of implanting, into the primary surface of the first semiconductor region, an ion of the second conductive type impurity to a prescribed dose amount, to form a silcide layer to a prescribed thickness; thereafter a step of forming a source/drain region by a heat treatment; a step of coating a metallic layer over a surface of the source/drain region and a surface of the gate electrode; and a step of reacting the metallic layer with silicon on the surface of the source/drain region and the surface of the gate electrode by a heat treatment, to form a metallic silicide layer.

According to the foregoing procedures, it becomes possible that formation of residual defects in the deep ion implantation region near the position of the PN junction will be suppressed, and in the shallow ion implantation region at the surface region, the metallic silicide layer having a thickness sufficient to decrease the sheet resistance is formed. Thus, the metallic silicide layer having a low resistance that does not increase the PN junction leakage can be formed simultaneously on the surface of the semiconductor region and the surface of the gate electrode. Therefore, a MOS semiconductor device having a fine pattern and which is suitable for high speed operation can be obtained.

The invention also relates to a method of fabricating a CMOS semiconductor device characterized by comprising a step of forming, on a primary surface of a semiconductor substrate, a first well of a first conductive type and a second well of a second conductive type; a step of forming a gate insulating film on surfaces of the first well and the second well; a step of forming, on the gate insulating film formed on the surface of the first well, a first gate electrode comprising polycrystalline silicon, and forming, on the gate insulating film formed on the surface of the second well, a second gate electrode comprising polycrystalline silicon; a first ion implantation step of implanting, into a part of a primary surface of the first well not having the first gate electrode formed, an ion of a second conductive type impurity; a second ion implantation step of implanting, into a part of a primary surface of the second well not having the second gate electrode formed, an ion of a first conductive type impurity; a step of forming, on side walls of the first and second gate electrodes, a side wall spacer; a third ion implantation step of implanting, into a part of the primary surface of the first well not having the first gate electrode and the side wall spacer formed, an ion of the second conductive type impurity, which is the reverse of the first conductive type, to form a source/drain region constituting a PN junction with the first well; a fourth ion implantation step of implanting, into the primary surface of the first well subjected to the third ion implantation step, an ion of the second conductive type impurity, to form a silicide layer to a prescribed thickness; a fifth ion implantation step of implanting, into a part of the primary surface of the second well not having the second gate electrode and the side wall spacer formed, an ion of the first conductive type impurity, to form a source/drain region constituting a PN junction with the second well; a sixth ion implantation step of implanting, into the primary surface of the second well subjected to the fifth ion implantation step, an ion of the first conductive type impurity, to form a silicide layer to a prescribed thickness; thereafter a step of forming, in the first and second wells, a source/drain region by a heat treatment; a step of coating a metallic layer over a surface of the source/drain region in the first and second well and a surface of the first and second gate electrodes; and a step of reacting the metallic layer with silicon of the surface of the source/drain region in the first and second wells and the surface of the first and second gate electrodes by a heat treatment, to form a metallic silicide layer.

According to the foregoing procedures, it becomes possible that formation of residual defects in the deep ion implantation region near the position of the PN junction in the well regions will be suppressed, and in the shallow ion implantation region at the surface region, the metallic silicide layer having a thickness sufficient to decrease the sheet resistance is formed. Thus, the metallic silicide layer having a low resistance that does not increase the PN junction leakage can be formed simultaneously on the surface of the source/drain region and the surface of the gate electrode in the well regions. Therefore, a CMOS semiconductor device having a fine pattern and which is suitable for high speed operation can be obtained.

BRIEF DESCRIPTION OF THE DRAWINGS

FIG. 19 relates to the example of the invention and is a diagram showing the generation of p+/n leakage on variation of the thickness of the high concentration layer.

FIG. 20 relates to the example of the invention and is a diagram showing the generation of p+/n junction leakage on variation of the junction depth.

FIG. 21 relates to the example of the invention and is a diagram showing the generation of p+/n junction leakage on variation of the conditions of the activation heat treatment.

FIG. 22 is a cross sectional view showing a production process of a CMOS semiconductor device of another embodiment of the invention.

BEST MODE FOR PRACTICING THE INVENTION

In order to describe the invention in more detail, reference will be made to an embodiment illustrated in the attached drawings.

Figure 1:
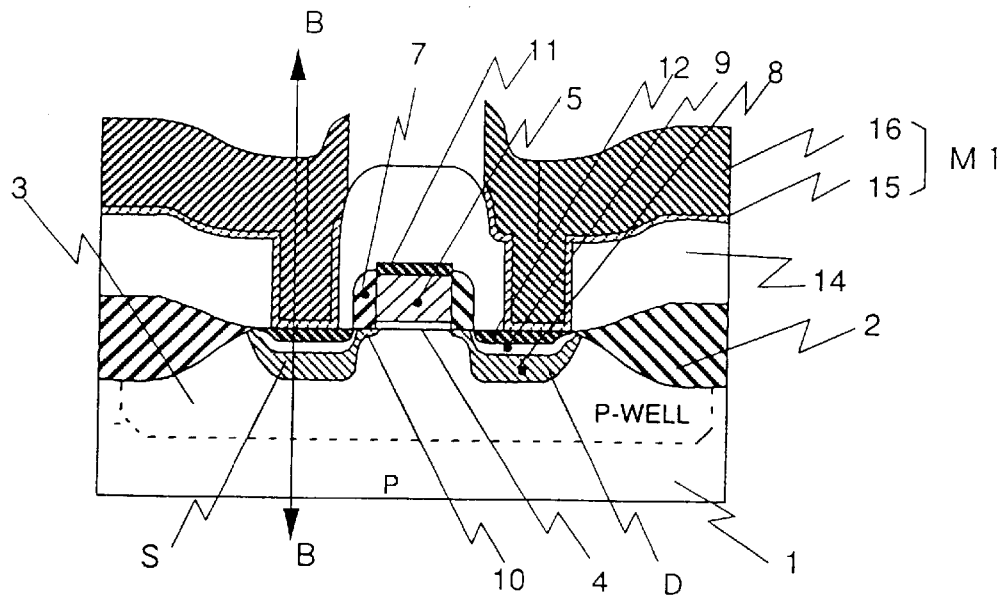
FIG. 1 is a view showing a cross sectional structure of a MOS semiconductor device according to the invention.
Figure 2:
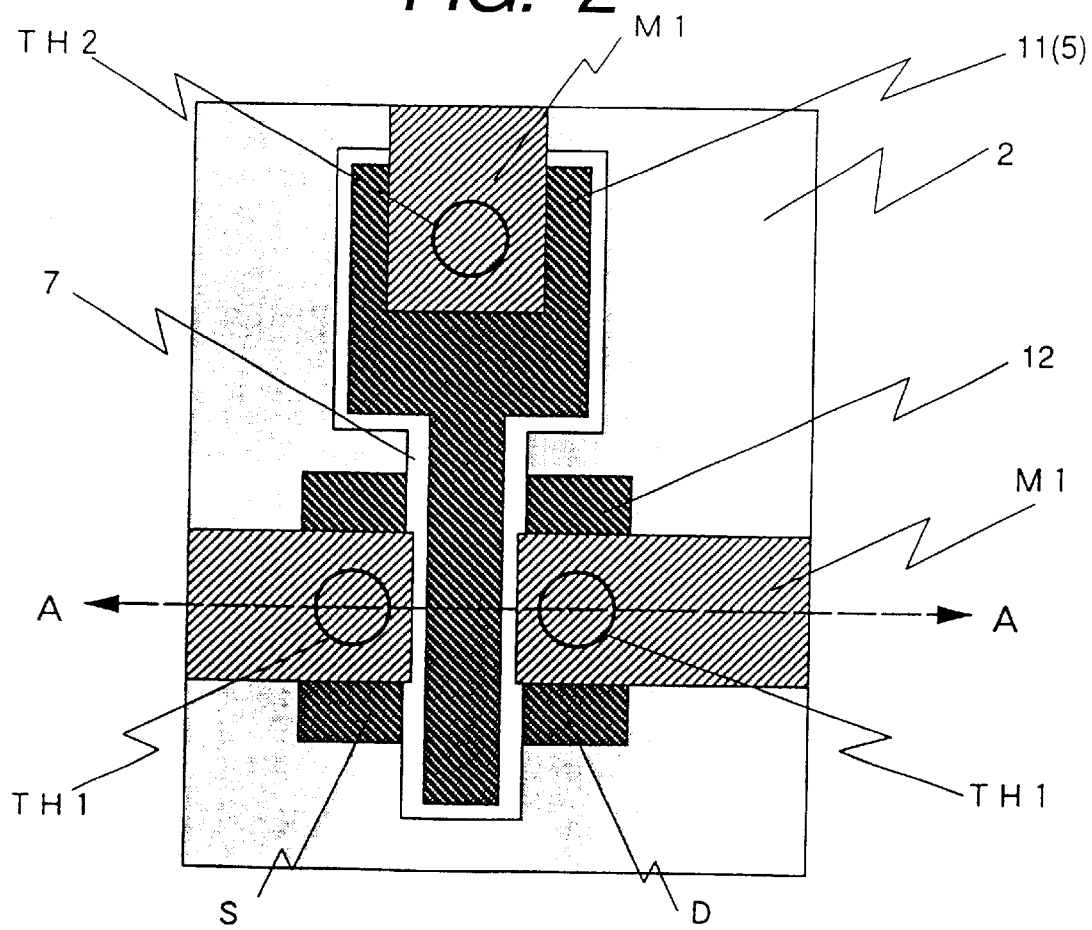
FIG. 2 is a view showing a plan structure of a MOS semiconductor device according to the invention.

FIG. 1 is a cross sectional view of a MOS semiconductor device formed according to a specific example of the invention, and FIG. 2 is a plan view of the MOS semiconductor device. The cross section as seen on the line A—A in FIG. 2 is shown in FIG. 1.

The MOS semiconductor device shown in FIG. 1 is, for example, a second conductive type (N-type) channel MOS transistor formed on a first conductive type (P-type) single crystal silicon (Si) substrate 1. As shown in FIG. 1, a MOS transistor having an LDD (lightly doped drain) structure is formed in a P well sectioned by an oxide film for element isolation (LOCOS film) 2. A source region S and a drain region D of the MOS transistor (hereinafter, these are referred to a source/drain region) each comprises a relatively shallow N-type first region 10 self-aligned with a gate electrode 5, a relatively deep N-type second region 8 self-aligned with a side wall spacer 7 and constituting a PN junction with the P well 3, and an N-type third region 9 having a relatively high concentration and a medium depth that is deeper than the N-type first region 10, but shallower than the second region 8, and self-aligned with the side wall spacer 7. On a surface of the source/drain region, a cobalt silicide film ($CoSi_2$ layer) 12 is formed to obtain a low resistance. As shown in FIG. 2, the $CoSi_2$ layer 12 is formed on the whole surface of the source/drain region (SD) sectioned by the gate electrode 5 having the side wall spacer 7 and the LOCOS film 2.

The N-type third region 9 is provided to form the $CoSi_2$ layer 12 having a high concentration and a low resistance, and most of the third region 9 is converted into the $CoSi_2$ layer. This means that it is not necessary that the whole of the third region 9 be completely converted into $CoSi_2$. On the other hand, the N-type second region 8 has a low concentration and is formed at a deep position to constitute the PN junction with the P well 3 at a position having no relationship to the formation of the $CoSi_2$ layer.

The relationship among the relative depth of the N-type second region, the N-type third region and the $CoSi_2$ layer is an important point to accomplish the objects of the invention, and will be described later in detail.

The gate electrode 5 comprises polycrystalline silicon containing an N-type impurity, and a $CoSi_2$ layer 11 is formed on the surface thereof to obtain a low resistance.

A passivation film 14 is coated on the surface of the silicon substrate, on which the N-channel MOS transistor is formed. As shown in FIG. 2, a contact hole TH1 to expose a part of the $CoSi_2$ layer 12 formed on the surface of the source drain region (SD) and a contact hole TH2 to expose a part of the $CoSi_2$ film 11 formed on the surface of the gate electrode 5 are formed in the passivation film 14. A metallic wiring M1 of a laminated layer comprising a barrier layer 15 and a tungsten layer 16 is connected to the $CoSi_2$ layer 12 formed on the surface of the source/drain region (SD) through the contact hole TH1. The metallic wiring M1 of the laminated layer comprising the barrier layer and the tungsten layer is connected to the $CoSi_2$ layer 12 formed on the surface of the gate electrode 5 through the contact hole TH2. The barrier layer (15) is formed to prevent the reaction of tungsten and silicon (in the source/drain region and the gate electrode), and is constituted with a laminated layer comprising a lower layer of titanium (thickness: about 30 nm) and a upper layer of titanium nitride (thickness: from 50 to 70 nm). The thickness of the tungsten layer (16) is from 300 to 400 nm.

A production process of the CMOS semiconductor device as a specific example of the invention will be described with reference to FIGS. 3 to 11. In FIGS. 3 to 11, the left side of the figures shows the process of forming an N-channel MOS transistor (NMOS), and the right side of the figures shows the process of forming a P-channel MOS transistor (PMOS). The NMOS and the PMOS are formed on one semiconductor substrate (silicon substrate).

Figure 3:
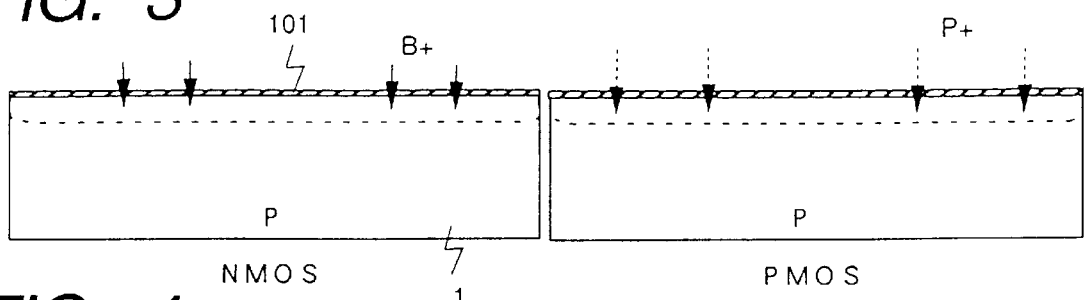
FIG. 3 is a cross sectional view showing a step of a production process of a CMOS semiconductor device.

(1) As shown in FIG. 3, a silicon wafer 1 is prepared as a semiconductor substrate. The silicon wafer 1 is obtained by slicing a single crystal ingot produced by a Czochralski method (CZ method), and a surface of the wafer 1 has a mirror polished (100) crystal plane.

A thermal oxidation film ($SiO_2$ film) 101 having a thickness of about 10 nm is formed on the surface of the wafer 1. Subsequently, ion implantation for forming an N well and a P well is respectively conducted. The side of the NMOS forming region is covered with a photoresist mask (not shown in the figure), and a phosphorous ion ($P^+$) is implanted into the side of the PMOS forming region not having the photoresist mask formed at a prescribed energy to a prescribed dose amount through the $SiO_2$ film 101. The side of the PMOS forming region is then covered with a photoresist mask (not shown in the figure), and a boron ion ($B^+$) is implanted into the side of the NMOS forming region not having the photoresist mask formed at a prescribed energy to a prescribed dose amount through the $SiO_2$ film 101.

As the semiconductor substrate (silicon wafer) 1 prepared herein, an epitaxial wafer, by which a gate oxide film having a small defect density is obtained, is preferably used. For example, as the epitaxial wafer, that comprising a $P^+$-type Si substrate (specific resistance: from 0.01 to 0.04 Ω·cm) having formed on the surface thereof a P-type epitaxial layer having a thickness of about from 4 to 5 μm (specific resistance: about 10 Ω·cm), or that comprising a P-type Si substrate (specific resistance: about 10 Ω·cm) having on the surface thereof a P-type epitaxial layer having a thickness of about from 1 to 3 μm (specific resistance: about 10 Ω·cm) is employed. The later epitaxial wafer has an advantage of low cost because auto-doping and out-diffusion from the substrate are small, and the epitaxial layer is thin.

Figure 4:
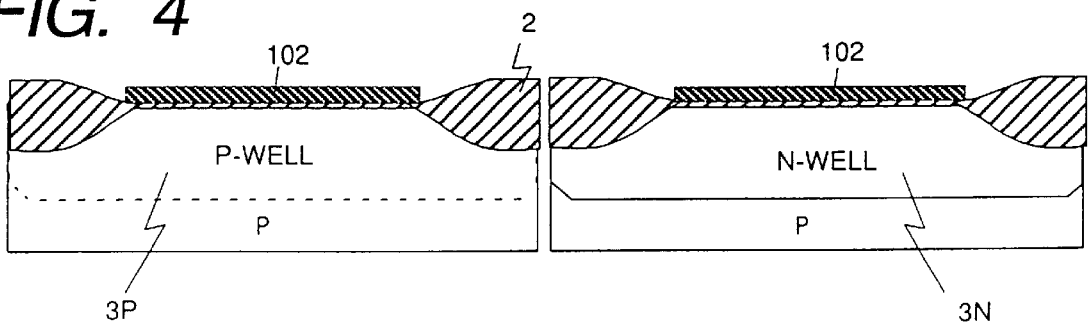
FIG. 4 is a cross sectional view showing a step of a production process of a CMOS semiconductor device, subsequent to FIG. 3.
Figure 5:
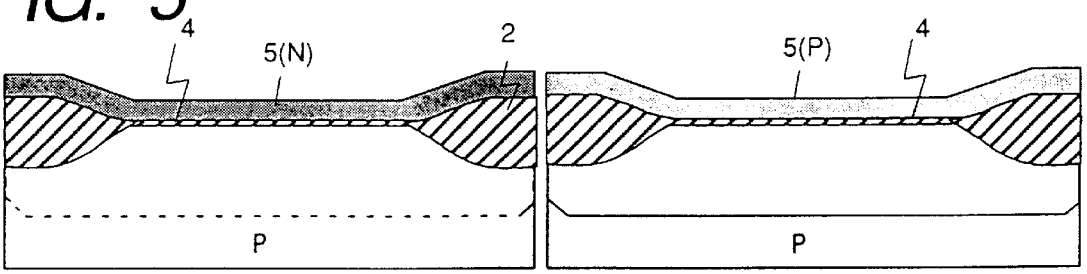
FIG. 5 is a cross sectional view showing a step of a production process of a CMOS semiconductor device, subsequent to FIG. 4.

(2) As shown in FIG. 4, a silicon nitride film ($Si_3N_4$ film) 102 is selectively formed by using a known photolithography technique on the $SiO_2$ film 101 to cover the PMOS forming region and the NMOS forming region. An oxidation film for element isolation, i.e., a so-called LOCOS film 2, (thickness: about 350 nm) is selectively formed by thermal oxidation of the surface of the substrate 1, on which the $Si_3N_4$ film 102 is not formed. On forming the LOCOS film, phosphorous (P) and boron (B) subjected to ion implantation into the substrate is thermally diffused, to form an N well 3N for forming the PMOS and a P well 3P for forming the PMOS at the prescribed depth.

(3) After removing the $Si_3N_4$ film 102 and the $SiO_2$ film 101, a gate oxide film 4 of 6 nm is formed on an active region (the PMOS forming region and the NMOS forming region) sectioned by the LOCOS oxide film 2. A non-doped polysilicon (polycrystalline silicon) film 5 having a thickness of 250 nm, for example, is then formed on the gate oxide film 4. Subsequently, an impurity is introduced into the non-doped polysilicon film 5 to obtain a low resistance. Specifically, the NMOS forming region is covered with a photoresist mask, and a boron ($B^+$) ion is selectively implanted into the polysilicon film 5, so as to obtain a doped polysilicon film 5(P) for forming the PMOS. Similarly, the PMOS forming region is covered with a photoresist mask, and a phosphorous ($P^+$) ion is selectively implanted into the polysilicon film 5, so as to obtain a doped polysilicon film 5(N) for forming the NMOS.

Figure 6:
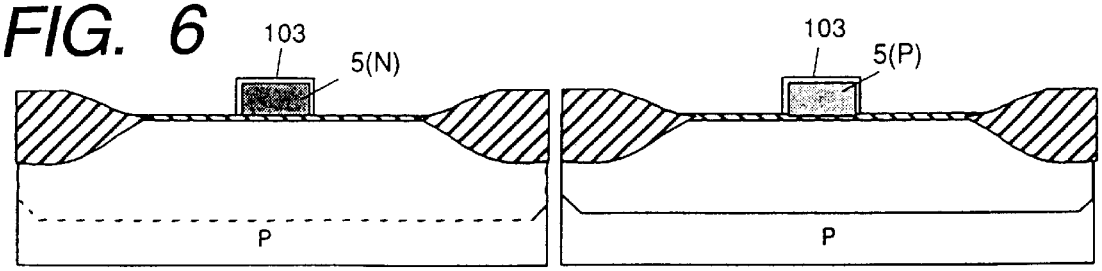
FIG. 6 is a cross sectional view showing a step of a production process of a CMOS semiconductor device, subsequent to FIG. 5.

(4) As shown in FIG. 6, the doped polysilicon films 5(P) and 5(N) are worked into a gate electrode pattern by a photo-etching process. An oxide film 103 is then formed by oxidizing the surface of the gate electrode, i.e., a so-called light oxidation treatment is conducted.

Figure 7:
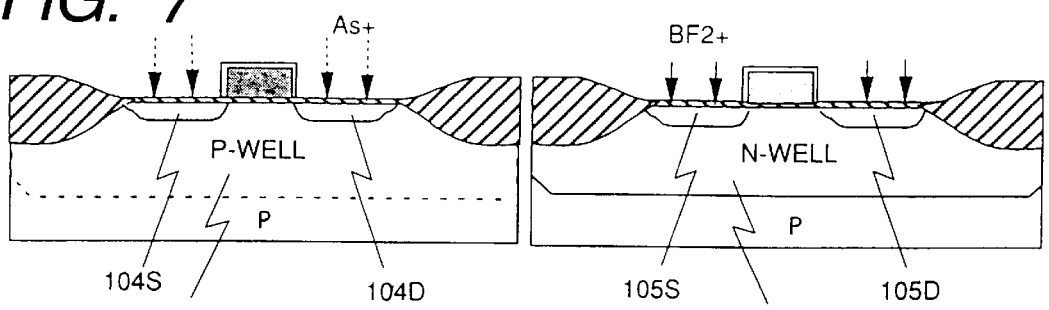
FIG. 7 is a cross sectional view showing a step of a production process of a CMOS semiconductor device, subsequent to FIG. 6.

(5) As shown in FIG. 7, in order to form an LDD (lightly doped drain), the NMOS forming region is covered with a photoresist mask, and a $BF_2^+$ ion is implanted into the N well 3N, on which the gate electrode and the LOCOS film are not formed. The conditions for the ion implantation are an energy of 10 keV and an implantation amount of $7\times10^{13}$ per $cm^2$. Similarly, the PMOS forming region is covered with a photoresist mask, and an As+ (Arsenic) ion is implanted into the P well 3P, on which the gate electrode and the LOCOS film are not formed. The conditions for the ion implantation are an energy of 20 keV and an implantation amount of $2\times10^{14}$ per $cm^2$. Subsequently, the impurities thus implanted are activated by a heat treatment for a short period of time (RTA: rapid thermal annealing) at 950° C. for 10 seconds, to form an N-type source/drain region (104S and 104D) and a P-type source/drain region (105S and 105D).

Figure 8:
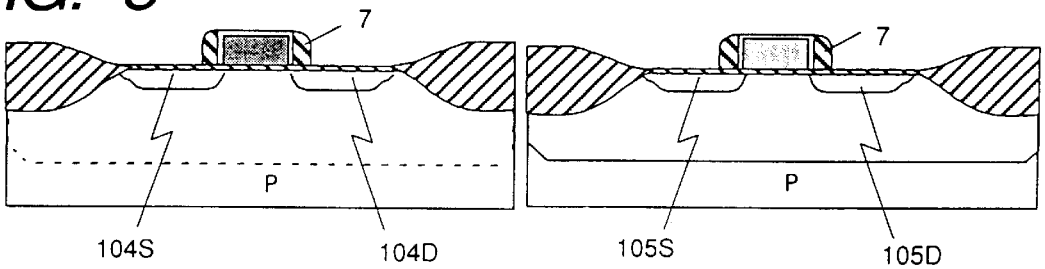
FIG. 8 is a cross sectional view showing a step of a production process of a CMOS semiconductor device, subsequent to FIG. 7.

(6) As shown in FIG. 8, a thermal CVD-$SiO_2$ film is formed on the Si substrate to 100 nm. The thermal CVD-$SiO_2$ film is then etched by an anisotropic dry etching technique to leave a side spacer 7 remaining. The side spacer 7 may comprise an SiN film instead of the thermal CVD-$SiO_2$ film. In the case of the SiN film, because an etching selective ratio can be ensured with respect to the underlayer $SiO_2$ film covering the surfaces of the gate electrode, the N-type source/drain region (104S and 104D) and the P-type source/drain region (105S and 105D), etching of the underlayer $SiO_2$ film on formation of the side spacer 7 can be suppressed.

Figure 9:
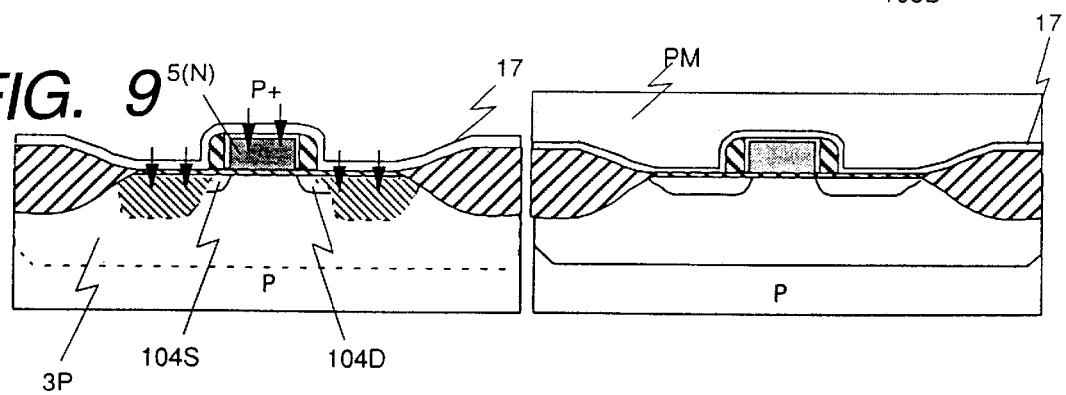
FIG. 9 is a cross sectional view showing a step of a production process of a CMOS semiconductor device, subsequent to FIG. 8.

(7) As shown in FIG. 9, a thermal CVD-$SiO_2$ film, as an ion implantation through film 17, is formed on the whole surface of the Si substrate 1 to 10 nm. Subsequently, the ion implantation, which is a characteristic feature of the invention, is conducted to form an N-channel MOSFET.

The first ion implantation (the third ion implantation step) is conducted to form a semiconductor region constituting a PN junction with the P well. That is, the PMOS forming region is covered with a photoresist mask PM, and ion implantation of a P+ ion is conducted on the surfaces of the N-type source/drain region (104S and 104D) and the gate electrode SN, on which the LOCOS film 2 is not formed. The conditions for the ion implantation are, for example, an energy of 40 keV and an implantation amount of $2\times10^{14}$ per $cm^2$.

Figure 10:
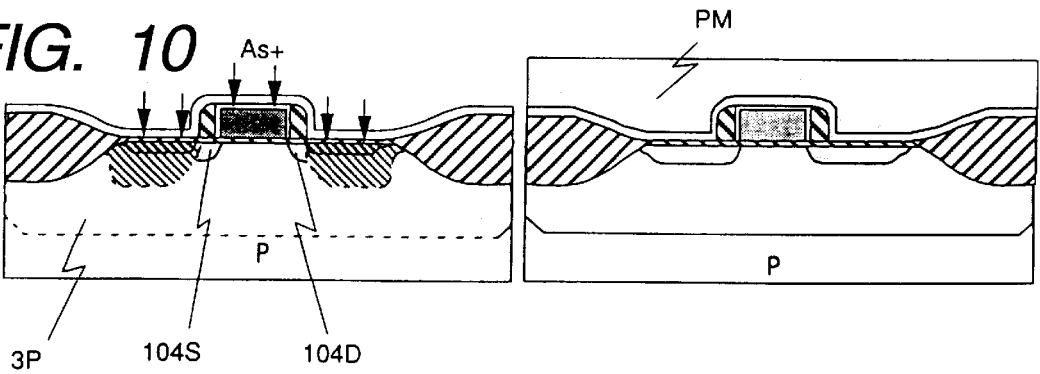
FIG. 10 is a cross sectional view showing a step of a production process of a CMOS semiconductor device, subsequent to FIG. 9.

(8) As shown in FIG. 10, the second ion implantation (the fourth ion implantation step) is conducted to form the N-type source/drain region (104S and 104D) and to form a silicide layer to a prescribed thickness on the surface of the gate electrode SN. As the impurity ion, As+ is applied. The conditions for the ion implantation are, for example, an energy of 60 keV and an implantation amount of $3\times10^{15}$ per $cm^2$.

Figure 11:
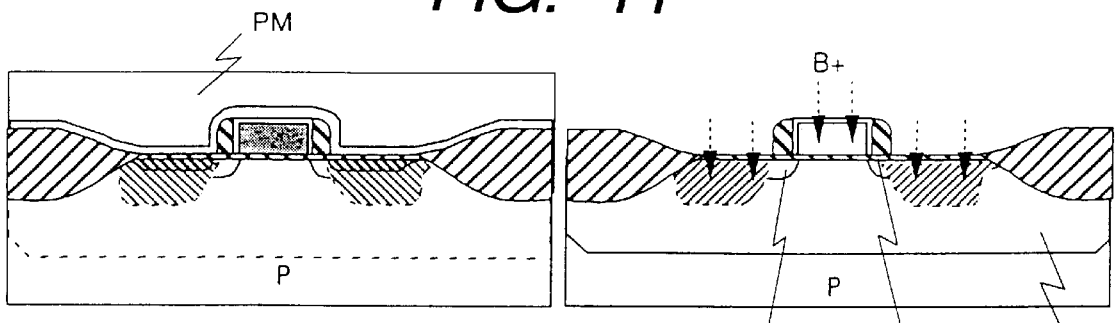
FIG. 11 is a cross sectional view showing a step of a production process of a CMOS semiconductor device, subsequent to FIG. 10.

(9) As shown in FIG. 11, the ion implantation, which is a characteristic feature of the invention, is conducted to form a P-channel MOS FET.

A first ion implantation (the fifth ion implantation step) is conducted to form a semiconductor region constituting a PN junction with the N well. That is, the NMOS forming region is covered with a photoresist mask PM, and ion implantation of a B+ ion is conducted on the surf aces of the P-type source/drain region (105S and 105D) and the gate electrode 5P, on which the LOCOS film 2 is not formed. The conditions for the ion implantation are, for example, an energy of 25 keV and an implantation amount of $1\times10^{14}$ per $cm^2$.

Figure 12:
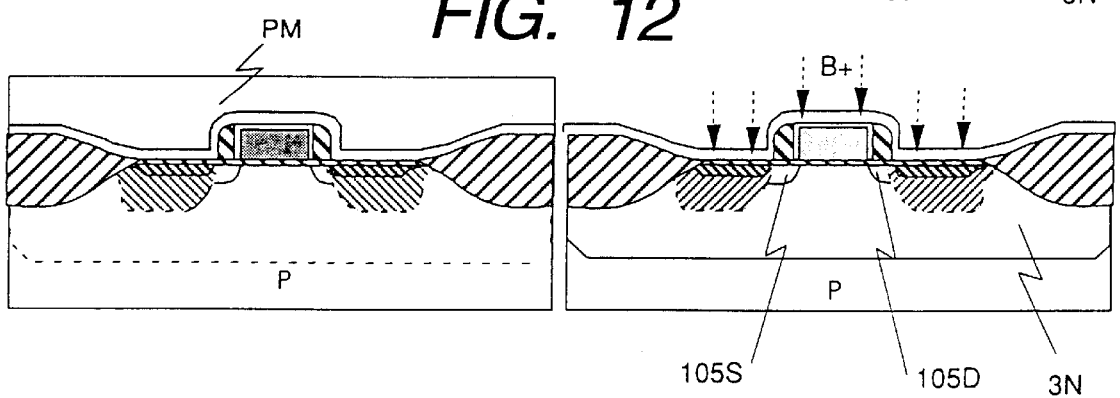
FIG. 12 is a cross sectional view showing a step of a production process of a CMOS semiconductor device, subsequent to FIG. 11.

(10) As shown in FIG. 12, a second ion implantation (the sixth ion implantation step) is conducted to form the N-type source/drain region (105S and 105D) and to form a silicide layer to a prescribed thickness on the surface of the gate electrode 5P. As the impurity ion, B+ is applied as similar to the first ion implantation. The conditions for the ion implantation are, for example, an energy of 5 kev and an implantation amount of $1\times10^{15}$ per $cm^2$.

Figure 13:
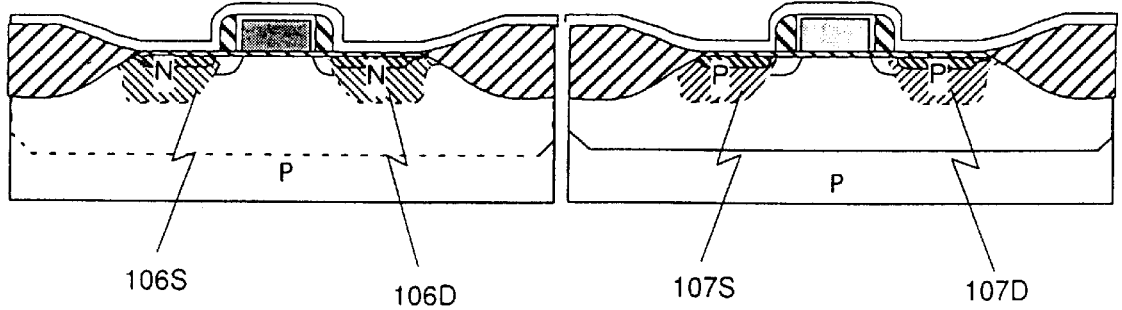
FIG. 13 is a cross sectional view showing a step of a production process of a CMOS semiconductor device, subsequent to FIG. 12.

(11) As shown in FIG. 13, the impurities thus subjected to ion implantation by the two separate steps for forming the N-channel MOS FET and the PN-channel MOS FET are activated by a heat treatment for a short period of time (RTA) at 950° C. for 10 seconds, so as to form the source/drain regions (106S, 106D, 107S and 107D). The depth of junction is 180 nm in the N-type source/drain region, and 250 nm in the P-type source/drain region. That in the shallow ion implantation layer (N+, P+ high concentration layer) is about 40 nm.

In accordance with the invention, the first ion implantation in the steps (7) and (9) forms a low concentration layer (a low concentration region) forming a deep PN junction, and the second ion implantation in the steps (8) and (10) forms a shallow high concentration layer (a high concentration region) becoming an underlayer for forming a silicide layer of a low resistance.

The conditions for the ion implantation for forming the LDD conducted in the step (5) are lighter than the second ion implantation for forming the source/drain region and are set in such a manner that the dose amount is 1/10 or less.

Figure 14:
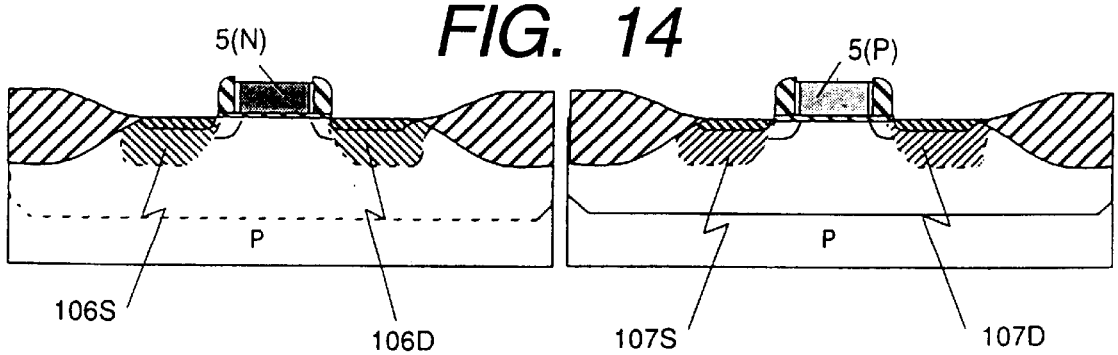
FIG. 14 is a cross sectional view showing a step of a production process of a CMOS semiconductor device, subsequent to FIG. 13.
Figure 15:
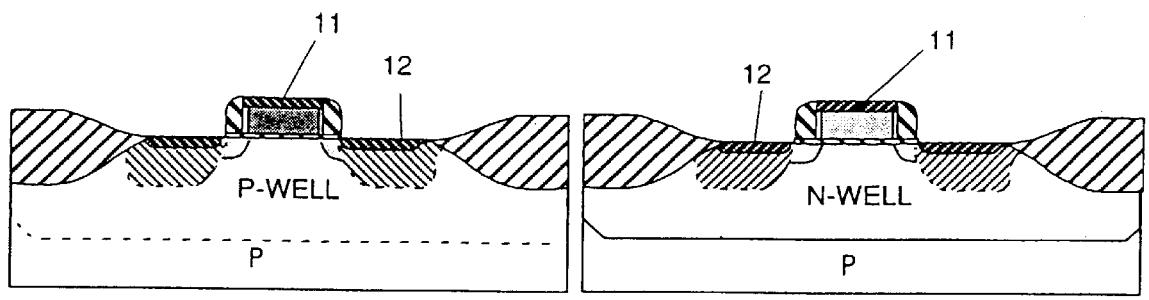
FIG. 15 is a cross sectional view showing a step of a production process of a CMOS semiconductor device, subsequent to FIG. 14.

(12) As shown in FIG. 14, the thermal CVD-$SiO_2$ film 17 as a through film for ion implantation is removed by wet etching, to expose the surface of the gate electrodes (5N and 5P) and the surface of the source/drain regions (106S, 106D, 107S and 107D).

(13) Subsequently, on the primary surface of the Si substrate 1, a Co film is formed to 10 nm, and then a TiN film is formed to 10 nm, by a DC magnetron sputtering method. The TiN film is formed to prevent oxidation of the surface of the Co film. As shown in FIG. 12, a heat treatment is conducted in a nitrogen atmosphere at 550° C. for 30 seconds, to selectively form a cobalt silicide layer only on the source/drain region and the gate electrode in contact with Co. The cobalt silicide in this step has a composition of Co/Si=1/x ($x \leqq 1$). After removing the unreacted Co film and TiN film by wet etching, a heat treatment (RTA) is conducted in a nitrogen atmosphere at 750° C. for 30 seconds, to convert the cobalt silicide layer to a compound having a constant ratio of Co/Si=½ ($CoSi_2$).

In accordance with the invention, because of the salicide process, in which the surface of the gate electrode is simultaneously converted into a silicide, a cobalt silicide layer 11 formed on the surface of the gate electrode and a cobalt silicide layer 12 formed by consuming Si (substrate) on the surface of the source/drain region are present. The thickness of the cobalt silicide layer (12) finally becomes 30 nm. The $CoSi_2$ film has a sheet resistance of 8.5 Ω per square, and a specific resistance of 25 $\mu\Omega\cdot$cm. A sheet resistance of 10 Ω per square is demanded for the diffusion layer (source/drain region) in a logic LSI, and the value sufficiently satisfies the demand.

The steps of formation of a passivation film and formation of wiring subsequent to the steps of forming the cobalt, silicide layer will be described with reference to FIG. 1.

(14) A passivation film 14 is coated on the Si substrate. Specifically, the passivation film 14 comprises a plasma CVD film or a plasma TEOS film. Alternately, it comprises a laminated layer comprising a PSG film for gettering of an impurity and the plasma process films described above.

Subsequently, in the passivation film 14, a contact hole TH1 for exposing a part of the $CoSi_4$ layer 12 formed on the surface of the source/drain region (SD) and a contact hole TH2 for exposing a part of the $CoSi_2$ layer 11 formed on the surface of the gate electrode 5 are respectively formed. Subsequently, a barrier layer 15 and a tungsten layer 16 are formed. The laminated film is patterned by a known photolithography technique to form a metallic wiring M1 of the laminated layer.

According to the procedures described in the, foregoing, a CMOS semiconductor device as one embodiment of the invention can be obtained.

Figure 16:
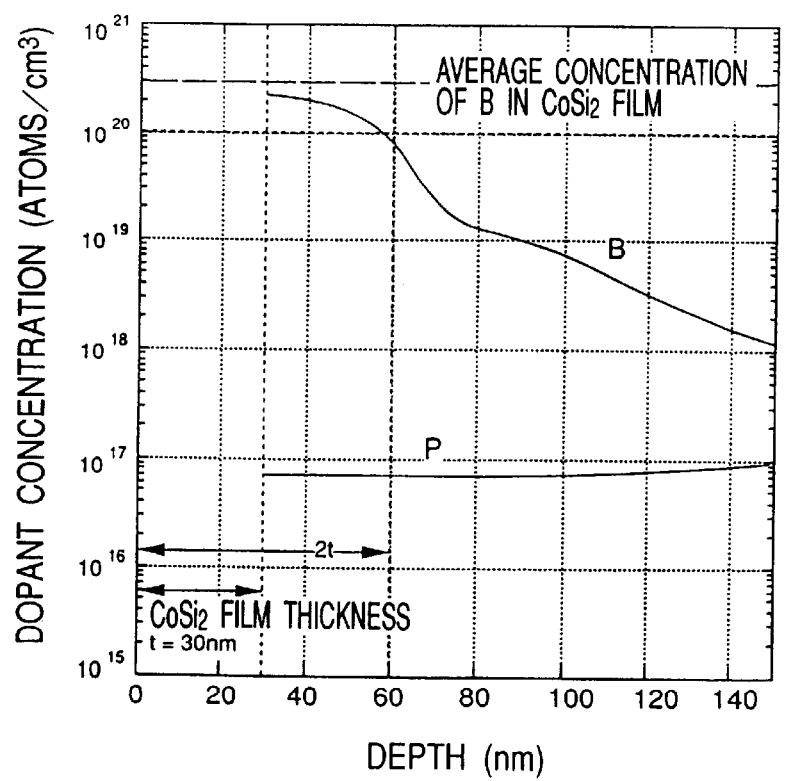
FIG. 16 is a diagram showing a profile of an impurity concentration in the depth direction of the source/drain region formed in the example of the invention.

FIG. 16 shows a SIMS (secondary ion mass spectrometry) depth profile of the source/drain region formed in the example. This depth profile is a depth profile measured in the region shown by the line B—B in the P-channel MOS FET shown in FIG. 1. In order to eliminate the influence of the $CoSi_2$ layer, this is a result of measurement taken after wet removing the $CoSi_2$ layer. In this example, the thickness of the $CoSi_2$ layer t is 30 nm, and in the depth profile, the B concentration already becomes $1\times10^{20}$ atoms/cm$^3$ or less at a depth of 60 rm. The thickness of the high concentration layer defined by the B concentration of $1\times10^{20}$ atoms/cm$^3$ or more is 27 nm, and 50% or more of the B diffusion layer is consumed for the formation of $CoSi_2$. Furthermore, in this example, the p+/n junction depth is a position of 240 nm including 30 nm for the $CoSi_2$ on the surface. When the cross section of the source/drain region is observed with a TEM (transmission electron microscope), numeral residual defects due to the second implantation for forming the source/drain region are observed at the position of the depth of about 40 nm from the surface of the substrate. On the other hand, residual defects due to the first ion implantation, which are considered to be present at a deeper position, are not observed. It is considered that this is because the amount of defects formed is small since the dose amount is as small as 1/10 of that of the second ion implantation, and they are recovered by the activation heat treatment. The maximum dose amount that does not generate residual defects in the first ion implantation is $3\times10^{14}$ atoms/cm$^2$. When the first ion implantation is conducted by dividing the process into plural steps, the total dose amount of each step must be $3\times10^{14}$ atoms/cm$^2$ or less.

As described in the foregoing, it is important to reduce the junction leakage so that the generation of residual defects by the ion implantation for forming the junction (the first ion implantation in this example) is suppressed as much as possible.

On the contrary, it is preferred that the second ion implantation for forming the high concentration layer is conducted to as high a dose as possible to increase residual defects generated. This is because by uniformly aggregating Co to the numeral residual defects, the abnormal growth of the individual $CoSi_2$ can be made small. Therefore, the second ion implantation must be conducted with at least a dose amount of $1\times10^{15}$ atoms /cm$^2$ or more. When the second ion implantation is conducted by dividing the process into plural steps, the total dose amount of each step must be $1\times10^{15}$ atoms/cm$^2$ or more.

Figure 17:
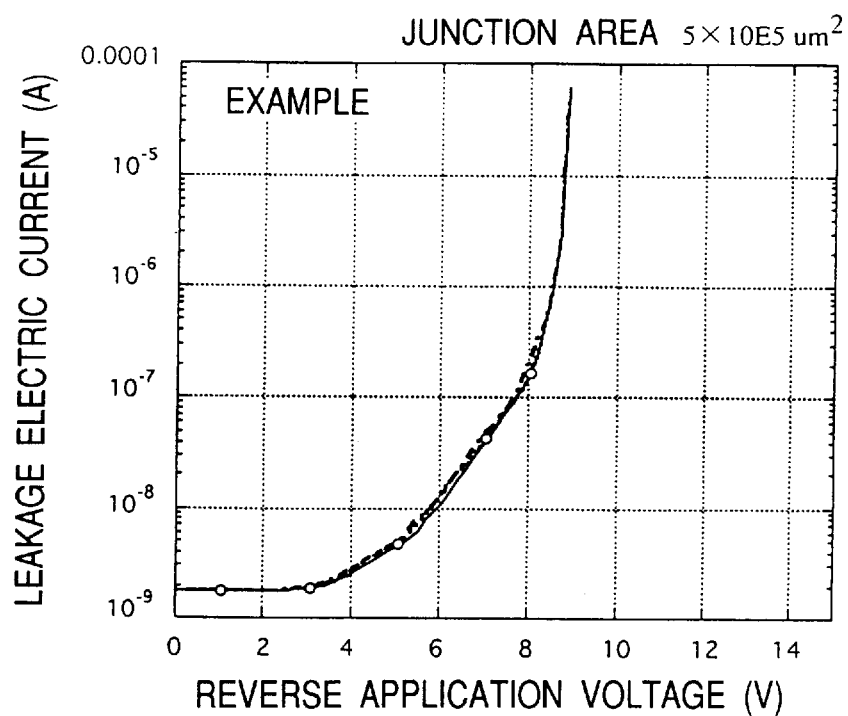
FIG. 17 is a diagram showing the reverse I-V characteristics of the p+/n junction formed in the example of the invention.
Figure 18:
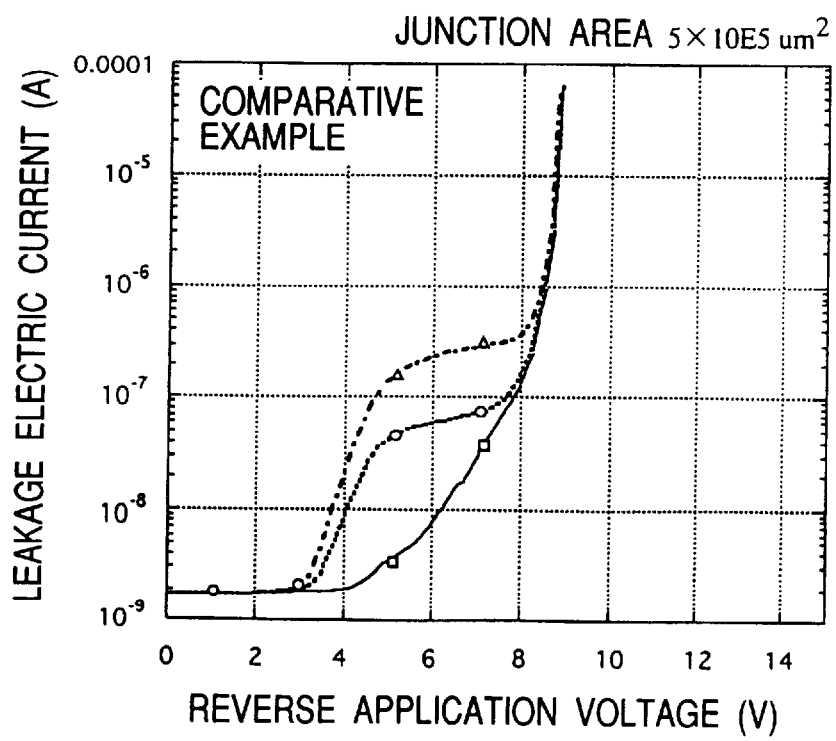
FIG. 18 is a diagram showing the reverse I-V characteristics of the p+/n junction formed under another condition for comparison with the example of the invention.

FIG. 17 shows the reverse I-V curve of the p+/n junction formed in this example. According to this example, the specification of the junction leakage electric current density of $1\times10^{-13}$ A/um$^2$ or less on application of 5 v (specification (1)) demanded by a logic LSI is satisfied. For comparison, a sample is formed by changing only the second ion implantation of the fabrication method of the example to a $BF_2^+$ ion, an energy of 40 keV and a dose amount of $1\times10^{15}$ per cm$^2$. This sample is referred to as a "comparative example" herein for convenience. The reverse I-V characteristics of the comparative example are measured. The reverse I-V curve of the p+/n junction of the comparative example (number of samples: 3) is shown in FIG. 18. In the case of the comparative example, the high concentration layer becomes about 65 nm to be a thickness exceeding the scope of this example, and the lower end of the high concentration layer is close to the p+/n junction plane. Accordingly, when the applied voltage is increased, a junction leakage electric current flows in some samples.

FIG. 19 shows generation of p+/n junction leakage on variation of the thickness of the high concentration layer. In the sample measured, in the two ion implantation processes to form the source/drain region, the conditions of the first implantation of an energy of 25 keV and an implantation amount of $1\times10^{14}$ are fixed, and the thickness of the high concentration layer is varied by conducting the second implantation with varying the energy. FIG. 19 shows the ratios of the samples that satisfy the specification (1) and the specification of the junction leakage electric current density of $5\times10^{-14}$ A/um$^2$ or less on application of 5 V (specification (2)), which is more severe than the specification (1). It can be well understood that when the thickness of the high concentration layer exceeds 30 nm, which is the same as the $CoSi_2$ layer, samples not satisfying the specifications appear.

The case will be described where the Co film formed on the Si substrate is made thick, to make the $CoSi_2$ layer formed by silicidation thicker than 30 nm. In this case, the thickness of the high concentration layer must be increased in proportion to the thickness of the $CoSi_2$ layer. One of the reasons for this is that the amount of reacting Co is increased to make the depth of the abnormal growth $Co_2Si$ deeper, and thus, in order to suppress it into the high concentration layer, a thicker high concentration layer is required. When the consuming thickness of the Si substrate is increased, the high concentration layer must be formed at a deeper position by increasing the energy of the second implantation for forming the high concentration layer, and it is necessary to increase the thickness of the high concentration layer in proportion to the thickness of the $CoSi_2$ layer from the standpoint that when the implantation energy is increased, the depth profile of the dopant is broadened to make the control different in the depth direction, and thus the scale must be enlarged as a whole.

The case will be described where the Co film formed on the Si substrate is made thin on the contrary, to make the $CoSi_2$ layer thinner than 30 nm. In this case, however, a $CoSi_2$ layer of at least 20 nm is necessary because the resistance of the $CoSi_2$ layer is increased to decrease the advantage of the silicidation on the source/drain region. According to the invention, when the $CoSi_2$ layer is made thin, the necessary thickness of the high concentration layer is also small as a matter of course, but it is practically advantageous to use a high concentration layer of about 30 nm including some allowance, but not to use an excessively thin high concentration layer. That is, there are disadvantages of thinning the high concentration layer in that technical difficulty is increased since implantation with a lower energy is required to form the thin high concentration layer, and the allowance for fluctuation in film thickness of the $CoSi_2$ layer is reduced.

FIG. 20 shows generation of p+/n junction leakage on variation of the junction depth. In the sample measured in FIG. 17, contrary to the samples in FIG. 19, in the two ion implantation process for forming the source/drain region, the conditions of the second implantation of an energy of 5 keV and an implantation amount of $1\times10^{15}$ are fixed, and the junction depth is varied by conducting the first implantation while varying the energy. FIG. 17 shows the ratios of the samples that satisfy the specification (1) and the specification (2). It is understood that when the junction depth $X_j$ becomes shallow to $X_j<4\times t$ with respect to the thickness $t=30$ nm of the $CoSi_2$ layer, samples not satisfying the specifications appear.

FIG. 21 is a diagram showing the influence of the activation heat treatment of the dopant. FIG. 21 shows the ratios of the samples satisfying the specification (1) and the specification (2) when only the conditions of the activation heat treatment after the ion implantation for forming the source/drain region are changed from the example. Samples not satisfying the specifications appear when the heat treatment temperature is 850° C., and thus a temperature of 900° C. or more is required for the activation heat treatment after the implantation of the source/drain region. However, because heat diffusion of the dopant occurs when the heat treatment is conducted at 900° C. or more to bring about a danger of deteriorating the device characteristics, it is necessary that the treatment time is 60 seconds or less to suppress the heat diffusion of the dopant at the minimum. That is, while the invention is able to suppress the abnormal growth of $Co_2Si$ becoming a cause of the junction leakage due to aggregation of Co, by decreasing the residual defects in the vicinity of the p/n junction, in the case where the heat diffusion due to the activation heat treatment of the dopant is considerable, the position of generation of the residual defects and the position of the p/n junction deviate from each other, and thereby the junction leakage itself is decreased. The reason why the concentration profile of the dopant can be defined instead of the position and the density of the residual defects in the scope of the invention is that substantially no heat diffusion of the dopant occurs on the activation heat treatment of the dopant, and the concentration profile on the ion implantation is maintained as it is. Therefore, it becomes possible to handle the high concentration region of the dopant as the region where the residual defects are generated on implantation.

FIG. 22 shows another embodiment of the invention. That is, a shallow groove isolation layer 20 is employed instead of the LOCOS film 2 for element isolation in the former example. In this case, in comparison to the element isolation by the LOCOS film, there is no bird's beak problem, and further high integration becomes possible by flattening of the substrate (employment of CMP).

After forming the shallow groove isolation layer 20, P and N wells are formed. As the subsequent steps, the same steps as the former example from the step (3) in the former example are conducted.

Finally, the concept of the invention is summarized as follows: When an Si substrate having a Co film adhered thereto is heated, Co firstly diffuses into the Si substrate to form a compound $Co_2Si$. At this time, Co diffuses into a deep position of the substrate by tracing residual defects having a linear form remaining in the Si substrate. There is a tendency that Co aggregates around the defects, and as a result, a phenomenon occurs in that $Co_2Si$ suffers abnormal growth into the deep position of the Si substrate at the defect part. In the case where the $Co_2Si$ thus abnormally grown reaches the vicinity of the p/n junction, junction leakage occurs at that position. When the implantation into the source/drain is conducted to a low concentration, i.e., the source/drain region is made to have a low concentration, the residual defects can be decreased to suppress the abnormal growth of $Co_2Si$. Accordingly, the junction leakage ascribed to the abnormal growth can be suppressed. However, only by simply making the source/drain region have a low concentration, the contact resistance between source/drain region and the $CoSi_2$ layer formed thereon becomes high. In order to prevent this, a high concentration layer is formed under the $CoSi_2$ layer. The high concentration layer is formed at a shallow position by ion implantation of high concentration, and this means that the layer contains a large amount of residual defects, into which a large amount of Co diffuses. In order to prevent the diffusion of Co into the deep position, the thickness of the high concentration layer is limited to the same value or less as the $CoSi_2$ layer. The high concentration layer is also effective to suppress the abnormal growth of $Co_2Si$. That is, since the residual defects are present in the high concentration layer at a high density, the abnormal growth of $Co_2Si$ frequently occurs. However, because it has numerous defects around the whole thereof, it is not the case where only a part of $Co_2Si$ considerably grows into the deep position, and the growth is terminated when it uniformly grows to the shallow position. Because the p/n junction is present at the far deeper position, the junction leakage does not occur when the abnormal growth is terminated at the shallow position. According to these mechanisms, the junction leakage is effectively suppressed.

Associated with fineness, the source/drain resistance is increased, and the contact resistance is also increased since the contact hole becomes small. Therefore, in the future, the silicidation of the source/drain cannot be avoided in any LSI product.

Therefore, the invention is effective to apply to a high speed logic lsi, a high speed sram, a dram and an on-chip lsi having both memory and logic.

What is claimed is:

1. A method of fabricating a semiconductor device comprising the steps of:
   (a) introducing a first impurity in a first semiconductor region of a semiconductor substrate;
   (b) introducing a second impurity in said first semiconductor region; and
   (c) after said steps (a) and (b), forming a metal-silicide layer formed by reacting metal and silicon at a surface portion of said first semiconductor region,
      wherein said first semiconductor region has a first conductivity type,
      wherein a second semiconductor region having a second conductivity type opposed to said first conductivity type is formed by using said steps (a) and (b),
      wherein a dose amount in said step (b) is greater than a dose amount in said step (a),
      wherein a dose amount in said step (b) is greater than $1 \times 10^{15}/cm^2$, and
      wherein said metal-silicide layer has an average thickness t such that a junction depth of said second semiconductor region is greater than $4 \times t$.

2. A method of fabricating a semiconductor device according to claim 1, further comprising the steps of:
   (d) before said steps (a) and (b), forming a gate electrode of an MISFET;
   (e) forming a side wall spacer on side surfaces of said gate electrode; and
   (f) before said step (e), introducing an impurity in said first semiconductor region to form a third semiconductor region of said second conductivity type,
      wherein said steps (a) and (b) are performed after said step (e),
      wherein a dose amount in said step (b) is greater than a dose amount in said step (f),
      wherein said second and said third semiconductor regions serve as source or drain region of said MISFET, and
      wherein said metal-silicide layer is a cobalt-silicide layer.

3. A method of fabricating a semiconductor device according to claim 2, wherein an impurity concentration of said second and said third semiconductor regions at a depth deeper than a depth 2×t from the surface thereof is equal to or less than $1\times10^{20}/cm^3$.

4. A method of fabricating a semiconductor device according to claim 1, wherein a dose amount in said step (a) is equal to or less than $3\times10^{14}/cm^2$, and wherein an introducing depth in said step (a) is greater than an introducing depth in said step (b).

5. A method of fabricating a semiconductor device according to claim 1, wherein said metal-silicide layer is a cobalt silicide layer.

6. A method of fabricating a semiconductor device comprising the steps of:

(a) introducing a first impurity in a first semiconductor region of a semiconductor substrate;

(b) introducing a second impurity in said first semiconductor region; and (c) after said steps (a) and (b), forming a metal-silicide layer formed by reacting metal and silicon at a surface portion of said first semiconductor region, wherein said first semiconductor region has a first conductivity type, wherein a second semiconductor region having a second conductivity type opposed to said first conductivity type is formed by using said steps (a) and (b), wherein a dose amount in said step (b) is greater than a dose amount in said step (a), and wherein said metal-silicide layer has an average thickness t such that an impurity concentration of said second semiconductor region at a depth deeper than a depth 2×t from the surface thereof is equal to or less than $1\times10^{20}/cm^3$.

7. A method of fabricating a semiconductor device according to claim 6, further comprising the steps of:

(d) before said steps (a) and (b), forming a gate electrode of an MISFET;

(e) forming a side wall spacer on side surfaces of said gate electrode; and (f) before said step (e), introducing an impurity in said first semiconductor region to form a third semiconductor region of said second conductivity type, wherein said steps (a) and (b) are performed after said step (e), wherein a dose amount in said step (b) is greater than a dose amount in said step (f), wherein said second and said third semiconductor regions serve as source or drain region of said MISFET, and wherein said metal-silicide layer is a cobalt-silicide layer.

8. A method of fabricating a semiconductor device according to claim 6 or 7, wherein a dose amount in said step (b) is greater than $1\times10^{15}/cm^2$, wherein a dose amount in said step (a) is equal to or less than $3\times10^{14}/cm^2$, and wherein an introducing depth in said step (a) is greater than an introducing depth in said step (b).

9. A method of fabricating a semiconductor device according to claim 6, wherein said metal-silicide layer is a cobalt silicide layer.

10. A method of fabricating a semiconductor device comprising the steps of:

(a) forming a gate electrode and a side wall spacer over a main surface of a first semiconductor region of a first conductivity type formed in a semiconductor body;

(b) after said step (a), implanting ions in said first semiconductor region to form a second semiconductor region of a second conductivity type opposite to said first conductivity type;

(c) after said step (a), implanting ions in said first semiconductor region to form a third semiconductor region of said second conductivity type; and (d) after said steps (b) and (c), forming a cobalt silicide layer in said second semiconductor region, wherein a dose amount in said step (b) is greater than a dose amount in said step (c) such that an impurity concentration of said second semiconductor region is greater than an impurity concentration of said third semiconductor region, wherein a junction depth of said third semiconductor region is greater than a junction depth of said second semiconductor region such that a PN junction is formed between said first semiconductor region and said third semiconductor region.

11. A method of fabricating a semiconductor device according to claim 10, wherein said cobalt silicide layer has an average thickness, and wherein impurity concentrations of the second and third semiconductor regions, at a depth deeper than a depth from the surface of the cobalt silicide layer that is twice said average thickness, is equal to or less than $1\times10^{20}/cm^3$.

12. A method of fabricating a semiconductor device according to claim 10, wherein said cobalt silicide layer has an average thickness, and wherein said junction depth of said third semiconductor region is greater than four times said average thickness.

13. A method of fabricating a semiconductor device according to claim wherein a dose amount in said step (b) is greater than $1\times10^{15}/cm^2$, and wherein a dose amount in said step (c) is equal to or less than $3\times10^{14}/cm^2$.

14. A method of fabricating a semiconductor device according to claim 10, said step (a) comprising the steps of:

(e) forming a gate electrode of an MISFET;

(f) after said step (e), introducing an impurity in said first semiconductor region to form a fourth semiconductor region of said second conductivity type; and (g) after said step (f), forming the side wall spacer on a side surface of said gate electrode, wherein said second, said third, and said fourth semiconductor regions serve as a source region or drain region of said MISFET.

15. A method of fabricating a semiconductor device according to claim 10, wherein said ions in said step (c) are phosphorus ions, and wherein said ions in said step (b) are arsenic ions.

16. A method of fabricating a semiconductor device according to claim 10, wherein before said steps (b) and (c), an insulating film is formed over said gate electrode, of a MISFET, and said surface of said first semiconductor region, wherein said steps (b) and (c) are conducted through said insulating film, and wherein a source region or a drain region of said MISFET is formed by performing a heat treatment with said insulating film remaining on said second and said third semiconductor regions.

17. A method of fabricating a semiconductor device comprising the steps of:

(a) forming a gate electrode and a side wall spacer over a main surface of a first semiconductor region of a first conductivity type formed in a semiconductor body;

(b) after said step (a), implanting ions in said first semiconductor region to form a second semiconductor region of a second conductivity type opposite to said first conductivity type;

(c) after said step (a), implanting ions in said first semiconductor region to form a third semiconductor region of said second conductivity type;

(d) after said steps (b) and (c), performing a heat treatment to said semiconductor body to activate said ions;

(e) after said step (d), coating a metallic layer over said second semiconductor region; and (f) reacting said metallic layer with silicon of said second semiconductor region by a heat treatment, to form a metallic silicide layer, wherein a dose amount in said step (b) is greater than a dose amount in said step (c) such that an impurity concentration of said second semiconductor region is greater than an impurity concentration of said third semiconductor region, and wherein a junction depth of said third semiconductor region is greater than a junction depth of said second semiconductor region such that a PN junction is formed between said first semiconductor region and said third semiconductor region.

18. A method of fabricating a semiconductor device as claimed in claim 17, wherein said metallic silicide layer comprises cobalt silicide.

19. A method of fabricating a semiconductor device as claimed in claim 17, wherein said step of coating said metallic layer over said surface of said second semiconductor region is conducted by a sputtering method.

20. A method of fabricating a semiconductor device comprising the steps of:

(a) forming a gate electrode, containing a silicon film, over a main surface of a first semiconductor region of a first conductivity type formed in a semiconductor body;

(b) after said step (a), implanting ions in said first semiconductor region to form a second semiconductor region of a second conductivity type opposite to said first conductivity type;

(c) after said step (b), forming a side wall spacer on a side surface of said gate electrode;

(d) after said step (c), implanting ions in said first semiconductor region to form a first region of said second conductivity type;

(e) after said step (c), implanting ions in said first semiconductor region to form a second region of said second conductivity type, wherein said second region extends deeper into the first semiconductor region, in a direction from said main surface, than does the first region, and wherein the first region has a higher impurity concentration than does the second region;

(f) forming a source/drain region by performing a heat treatment to said first region and said second region;

(g) after said step (f), coating a metallic layer over said first region and said gate electrode; and (h) reacting said metallic layer with silicon of said first region and of said gate electrode by a heat treatment, to form a metallic silicide layer, wherein a dose amount in said step (d) is greater than a dose amount in said step (e) such that the impurity concentration of said first region is greater than the impurity concentration of said second region, and wherein a junction depth of said second region is greater than a junction depth of said first region such that a PN junction is formed between said first semiconductor region and said second region.

21. A method of fabricating a semiconductor device as claimed in claim 20, wherein said method further comprises the steps of:

forming, after forming said metallic silicide layer, an interlevel dielectric film over said gate electrode and said source/drain region;

forming, in said interlevel dielectric film, a contact hole for exposing a part of said metallic silicide layer on said surface of said gate electrode and said surface of said source/drain region; and forming, in said contact hole, a high melting point metal wiring electrically connecting to said metallic silicide layer through an electrically conductive barrier layer.

22. A method of fabricating a semiconductor device as claimed in claim 21, wherein said barrier layer comprises titanium nitride, and said high melting point metal wiring comprises tungsten.

23. A method of fabricating a semiconductor device as claimed in claim 20, wherein said metallic silicide layer comprises cobalt silicide.

24. A method of fabricating a semiconductor device as claimed in claim 20, wherein said step of coating said metallic layer over said surface of said second semiconductor region is conducted by a sputtering method.

25. A method of fabricating a semiconductor device according to claim 20, wherein after said step (c) an insulating film is formed over said gate electrode and said surface of said first semiconductor region, wherein said steps (d) and (e) are conducted through said insulating film, and wherein said source/drain region is formed by said heat treatment with said insulating film remaining.

26. A method of fabricating a semiconductor device according to claim wherein 25, said ions in said step (e) are phosphorus ions, wherein said ions in said step (d) are arsenic ions.

27. A method of fabricating a semiconductor device according to claim 20, wherein before said steps (b) and (c), an insulating film is formed over said gate electrode, of a MISFET, and said surface of said first semiconductor region, wherein said steps (b) and (c) are conducted through said insulating film, and wherein the source region or the drain region, which is a source region or a drain region of said MISFET, is formed by performing the heat treatment with said insulating film remaining on said second and said third semiconductor regions.

28. A method of fabricating a semiconductor device according to claim 20, wherein said ions in said step (c) are phosphorus ions, and wherein said ions in said step (b) are arsenic ions.

29. A method of fabricating a semiconductor device comprising the steps of:

(a) forming a gate electrode of an MISFET and a side wall spacer over a main surface of a first semiconductor region of a first conductivity type formed in a semiconductor body;

(b) after said step (a), introducing a first impurity in said first semiconductor region to form a first region of said second conductivity type;

(c) after said step (a), introducing a second impurity in said first semiconductor region to form a second region of said second conductivity type, wherein said second region extends deeper into the first semiconductor region, in a direction from said main surface, than does the first region, and wherein the first region has a higher impurity concentration than does the second region; and (d) after said steps (b) and (c), forming a cobalt silicide layer in said first region, wherein a dose amount in said step (b) is greater than a dose amount in said step (c) such that an impurity concentration of said first region is greater than an impurity concentration of said second region, wherein a junction depth of said second region is greater than a junction depth of said first region such that a PN junction is formed between said first semiconductor region and said second region, and wherein said first region and said second region together serve as a source region or a drain region of said MISFET.

30. A method of fabricating a semiconductor device according to claim 29, said step (a) comprising the steps of:

(e) forming a gate electrode of an MISFET;

(f) after said step (e), introducing an impurity in said first semiconductor region to form a second semiconductor region of said second conductivity type; and (g) after said step (f), forming a side wall spacer on a side surface of said gate electrode, wherein said second semiconductor region serves as said source region or drain region of said MISFET.

31. A method of fabricating a semiconductor device according to claim 30, wherein said second impurity is phosphorus, and wherein said first impurity is arsenic.

32. A method of fabricating a semiconductor device according to claim 29, wherein said second impurity is phosphorus, and wherein said first impurity is arsenic.

33. A method of fabricating a semiconductor device according to claim 29, wherein before said steps (b) and (c), an insulating film is formed over said gate electrode and said surface of said first semiconductor region, wherein said steps (b) and (c) are conducted through said insulating film, and wherein said source region or drain region is formed by performing a heat treatment with said insulating film remaining on said first region and said second region.

34. A method of fabricating a semiconductor device comprising the steps of:

(a) forming a gate electrode of an MISFET and a side wall spacer over a main surface of a first semiconductor region of a first conductivity type formed in a semiconductor body;

(b) after said step (a), introducing a first impurity in said first semiconductor region to form a first region of said second conductivity type;

(c) after said step (a), introducing a second impurity in said first semiconductor region to form a second region of said second conductivity type, wherein said second region extends deeper into the first semiconductor region, in a direction from said main surface, than does the first region, and wherein the first region has a higher impurity concentration than does the second region; and (d) after said steps (b) and (c), forming a metallic silicide layer in said first region, wherein a dose amount in said step (b) is greater than a dose amount in said step (c) such that the impurity concentration of said first region is greater than the impurity concentration of said second region, wherein a junction depth of said second region is greater than a junction depth of said first region such that a PN junction is formed between said first semiconductor region and said second region, and wherein said second region and said first region serve as a source region or a drain region of said MISFET.

35. A method of fabricating a semiconductor device according to claim 34, said step (a) comprising the steps of:

(e) forming a gate electrode of the MISFET;

(f) after said step (e), introducing an impurity in said first semiconductor region to form a second semiconductor region of said second conductivity type; and (g) after said step (f), forming a side wall spacer on side surface of said gate electrode, wherein said second semiconductor region serves as said source region or drain region of said MISFET.

36. A method of fabricating a semiconductor device according to claim 34, wherein said second impurity is phosphorus, and wherein said first impurity is arsenic.

37. A method of fabricating a semiconductor device according to claim 34, wherein before said steps (b) and (c), an insulating film is formed over said gate electrode and said surface of said first semiconductor region, wherein said steps (b) and (c) are conducted through said insulating film, and wherein said source region or drain region is formed by performing a heat treatment with said insulating film remaining on said first region and said second region.

* * * * *